United States Patent
Yanagisawa et al.

[11] Patent Number: 5,980,769
[45] Date of Patent: Nov. 9, 1999

[54] PLASMA ETCHING METHOD

[75] Inventors: Michihiko Yanagisawa; Shinya Iida, both of Ayase, Japan

[73] Assignee: Speedfam Co., Ltd., Tokyo, Japan

[21] Appl. No.: 08/965,281

[22] Filed: Nov. 6, 1997

[30] Foreign Application Priority Data

Nov. 18, 1996 [JP] Japan ..................... 8-322241

[51] Int. Cl.⁶ ............... B44C 1/22; C03C 15/00
[52] U.S. Cl. ............ 216/67; 216/71; 438/710; 438/729; 438/714
[58] Field of Search ............. 438/710, 713, 438/714, 729, 718, 719, 720, 721, 722, 723, 724, 725, 726, 727, 728; 216/67, 68, 69, 70, 71

[56] References Cited

U.S. PATENT DOCUMENTS

| | | | |
|---|---|---|---|
| 4,578,559 | 3/1986 | Hijikata et al. | 219/121 PE |
| 5,254,830 | 10/1993 | Bollinger et al. | |
| 5,352,324 | 10/1994 | Gotoh et al. | 156/643 |
| 5,376,224 | 12/1994 | Zarowin. | |
| 5,670,018 | 9/1997 | Eckstein | 156/643.1 |
| 5,879,573 | 3/1999 | Robinett | 216/59 |
| 5,895,582 | 4/1999 | Wilson et al. | 216/42 |

FOREIGN PATENT DOCUMENTS 4-246184  1/1991  Japan.
5-339762  12/1993  Japan.

*Primary Examiner*—Bruce Breneman
*Assistant Examiner*—Luz Alejandro
*Attorney, Agent, or Firm*—Snell & Wilmer

[57] ABSTRACT

A plasma etching method and apparatus are provided in which a distance between an ejection opening (20a) in a plasma generator (2) for ejecting an active species gas and a surface of an object to be etched can be changed to thereby shorten the time required for a surface flattening operation and reduce the cost of equipment as well. To this end, the ejection opening (20a) of a predetermined diameter is disposed in confrontation with a desired convex of the object to be etched in the form of a wafer (110). The active species gas in the form of an F gas (G) is ejected from the ejection opening (20a) to the convex to thereby flatten it through etching. A distance between the ejection opening and the convex is changed by means of a Z drive mechanism (4) to provide an etching area corresponding to an area of the convex, thus performing effective flattening of the wafer (110).

4 Claims, 11 Drawing Sheets

PLASMA ETCHING METHOD

BACKGROUND OF THE INVENTION

1. Field of the Invention

The present invention relates to a plasm etching method and apparatus for locally etching convex portions on a surface of an object to be treated.

2. Description of the Related Art

For a surface etching technology for etching a surface of an object such as a silicon wafer, there have been proposed a variety of techniques in which an object to be etched is exposed to a plasma-excited active species gas atmosphere so as to grind and polish the entire surface of the object, or in which an object to be etched is partially masked with a non-masked portion thereof being etched by means of an active species gas to form a circuit pattern.

In recent years, in place of the technique of etching the entire surface of an object, new technologies such as a TTV (Total Thickness Variation) technique, an LTV (Local Thickness Variation) technique and the like have been proposed in which convexes on a surface of an object to be etched such as a silicon wafer, a silicon-on-insulator device (SOI) and the like are subjected to localized etching, to thereby thin the etched object, or flatten the surface to improve variations in shaping or configuration of the object (for example, see Japanese Patent Laid-Open No. 6-5571).

FIG. 14 schematically shows the principle of such conventional techniques. In this figure, a reference numeral 100 designates a plasma generator which generates a plasma gas containing an active species gas G which is injected to a surface of an object to be etched in the form of a wafer 110 by means of a nozzle 101 through its opening 102.

The wafer 110 is disposed on and fixed to a stage 120 so that the stage 120 can be moved in horizontal directions to guide a convex portion 111 of the wafer 110 into a position just under the opening 102 of the nozzle 101. Then, the active species gas G is ejected to the convex portion 111 of the wafer 110 to locally etching the convex portion 111 to thereby flatten the surface of the wafer 110.

In the above-mentioned conventional techniques, however, there arise the following problems. The sizes or dimensions of respective convexes of the convex portion 111 are varying, that is, for example with a silicon wafer having a diameter of 8 inches, there is a first one having an angle-shaped configuration with a highest or thickest near-center portion and a lower peripheral portion, a second one having a cone-shaped bottom configuration with a highest or thickest peripheral portion and a lowest or thinnest central portion, a third one having a multitude of small convexes and concaves each having a diameter of less than several millimeters, and a fourth one of mixed type having a mixed configuration with at least two of the above types being superposed or mixed with each other. In this manner, the convexes on the surface of the wafer are not uniform in size or dimensions thereof and not of the single type, but varying in size and type thereof.

On the other hand, since the active species gas is ejected from the nozzle 101, the diameter D of the opening 102 of the nozzle 101 is substantially the same as the diameter of an area to be etched of the wafer 110, so that the area of the wafer 110 is uniformly etched by means of the active species gas G. Accordingly, in the case where the wafer 110 has a multitude of convexes 111 of varying diameters on a surface thereof, the diameter D of the nozzle opening 102 has to be set so as to meet the diameter of the smallest one of the convexes, as shown in FIG. 15. This is because if the diameter D of the nozzle opening 102 is set to a value corresponding to that of a larger convex 111b, concaves 112 near and around small convexes 111a are to be etched when etching the small convexes 111a. However, with the technique in which the diameter D of the nozzle opening 102 is matched to that of the smallest convex 111a, upon etching a larger convex 111b, a number of (i.e., from several to tens) etching treatments are required, thus prolonging the time necessary for one surface flattening operation.

For this reason, in order to carry out such a surface flattening operation in a short period of time using the above-mentioned conventional technique, it is generally required that a plurality (e.g., two in the illustrated example) of plasma generators 100-1, 100-2 having different diameters of nozzle openings be provided for respective treatment chambers A, B so as to etch the wafer 110 by means of the plasma generators 100-1, 100-2 in sequence. For example, the treatment chamber A is constructed such that it is equipped with the plasma generator 100-1 having a nozzle 101 with its opening of 30 mm, and the treatment chamber B is constructed such that it is equipped with the plasma generator 100-2 having a nozzle 101 with its opening of 7 mm. A wafer 110 is first supplied to the treatment chamber A in which relatively large convexes 111b on a surface of the wafer 110 each having a diameter equal to or greater than 30 mm are subjected to plasma etching. The wafer 110 thus treated is then transported to the treatment chamber B in which convexes 111 a each having a diameter less than 30 mm are plasma etched.

With such a technique, however, the surface flattening time is in fact shortened, but at least two treatment chambers A, B equipped with the plasma generators 100-1, 100-2 are required, resulting in a substantial increase in the cost of equipment. Moreover, the wafer 110 has to be transported from the treatment chamber A to the treatment chamber B, thus prolonging the time of the entire etching treatments required.

SUMMARY OF THE INVENTION

In view of the above, the present invention is intended to provide a novel and improved plasma etching method and apparatus in which a distance between an ejection opening in a plasma generator for ejecting an active species gas and a surface of an object to be etched can be changed to thereby shorten the time required for a surface flattening operation and reduce the cost of equipment as well.

In order to achieve the above object, according to one aspect of the present invention, there is provided a plasma etching method comprising the steps of:

disposing an ejection opening of a predetermined diameter in plasma generating means in confrontation with a prescribed convex of an object to be etched; and ejecting an active species gas from the ejection opening to the convex to thereby flatten it through etching;

wherein a distance between the ejection opening and the convex is changed to provide an etching area corresponding to an area of said convex.

With the above method, the active species gas is ejected from the ejection opening of the predetermined diameter in the plasma generating means toward the convex, whereby the convex is etched and flattened.

In the case of the convex being large, the distance between the ejection opening and the convex is increased, whereas in the case of the convex being small, the distance is decreased, so that there is ensured an etching area corresponding to the varying size or area of the convex, whether large or small, thus flattening the convex in an effective manner.

In a preferred form of the plasma etching method of the invention, a period of time of ejecting the active species gas is controlled in accordance with the area of the convex. Thus, the ejection time of the active species gas can be increased so as to flatten the convex having a large area in a reliable manner. On the other hand, the ejection time of the active species gas can be shortened so as to flatten the convex having a small area in a reliable and effective manner.

In a further preferred form of the plasma etching method of the invention, a density of the active species gas is controlled in accordance with the area of the convex. Thus, the density of the active species gas can be increased so as to flatten the convex having a large area in a reliable and effective manner. On the other hand, the density of the active species gas can be shortened so as to flatten the convex having a small area in a reliable and effective manner.

In a still further preferred form of the plasma etching method of the invention, a hydrogen gas is supplied to surroundings of the active species gas ejected from the ejection opening. Thus, the active species gas spreading outside the convex reacts with hydrogen, thereby preventing those portions of the object to be etched other than the convex from being etched unnecessarily.

According to another aspect of the present invention, there is provided a plasma etching apparatus comprising:

plasma generating means having an ejection opening of a predetermined diameter for ejecting an active species gas excited by a plasma;

distance changing means for changing a distance between the ejection opening of the plasma generating means and a convex of an object to be etched, the object being disposed in confrontation with the ejection opening; and first control means for controlling a distance-changing operation of the distance changing means in accordance with an area of the convex.

With the above construction, if the convex of the object to be etched confronting with the ejection opening of the plasma generating means is large, the first control means controls the distance changing means so as to increase the distance between the ejection opening and the convex, so that the active species gas from the ejection opening can diffuse in a wide area to spread over the entire surface of the convex to thereby flatten the large convex. On the other hand, if the convex is small, the distance between the ejection opening and the convex is decreased, so that diffusion of the active species gas becomes limited, allowing the active species gas to reach the small convex alone.

In a preferred form of the plasma etching apparatus of the invention, second control means is provided for controlling a period of time of ejecting the active species gas in accordance with the area of the convex. Thus, the second control means serves to increase the ejection time of the active species gas for a large convex, and decrease it for a small convex.

In a further preferred form of the plasma etching apparatus of the invention, third control means is provided for controlling a density of the active species gas in accordance with the area of the convex. Thus, the third control means serves to increase the density of the active species gas for a large convex, and decrease it for a small convex.

In a still further preferred form of the plasma etching apparatus of the invention, a hydrogen gas is supplied to surroundings of the active species gas ejected from the ejection opening.

The above and other objects, features and advantages of the present invention will more readily be understood by those skilled in the art from the following detailed description of the invention when taken in conjunction with the accompanying drawings.

DESCRIPTION OF THE PREFERRED EMBODIMENTS

Now, preferred embodiments of the present invention will be described in detail while referring to the accompanying drawings.

FIRST EMBODIMENT

Figure 1:
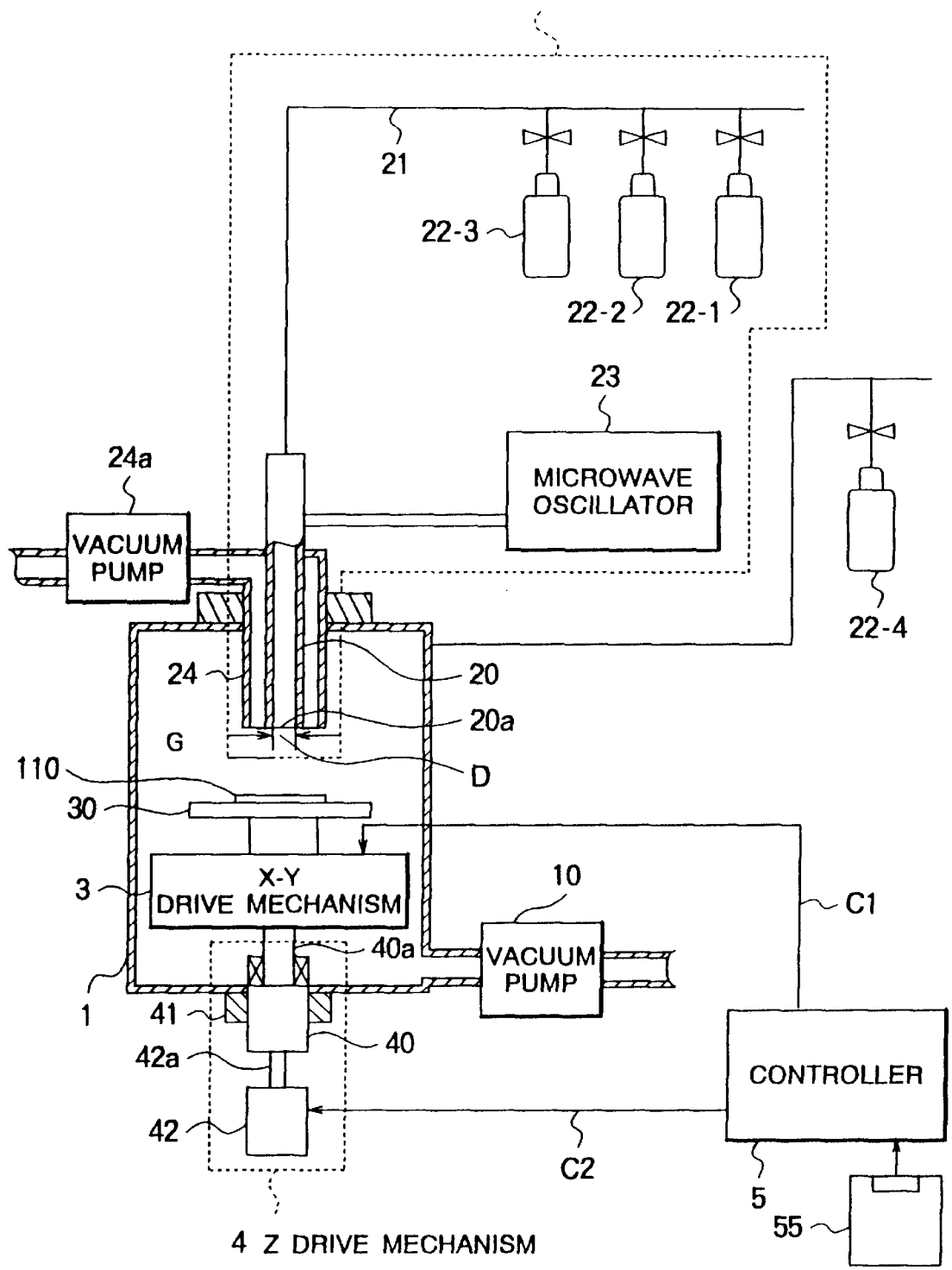
FIG. 1 is a schematic view showing a plasma etching apparatus in accordance with a first embodiment of the present invention.

FIG. 1 shows the construction of a plasma etching apparatus constructed in accordance with a first embodiment of the present invention.

The plasma etching apparatus as illustrated comprises a treatment chamber in the form of a vacuum vessel 1, a plasma generator 2 installed on the vacuum vessel 1, an X-Y drive mechanism 3 disposed in the vacuum vessel 1, a distance varying means in the form of a Z drive mechanism 4 disposed below the vacuum vessel 1, and a first and a second control means in the form of a controller 5.

The plasma generator 2 comprises a conduit 20, a plurality of gas cylinders 22-1, 22-2, 22-3 respectively storing gases to be supplied to the conduit 20 through supply pipes 21, and a microwave oscillator 23 mounted on an outer side of the conduit 20.

Specifically, the conduit 20 is fixed to an upper portion of the vacuum vessel 1 and has an ejection opening 20a of a predetermined inner diameter D directed toward a stage 30.

The gas cylinders 22-1, 22-2, 22-3 store a sulfur hexafluoride ($SF_6$) gas, an oxygen ($O_2$) gas, and an argon (Ar) gas, respectively.

The microwave oscillator 23 comprises a magnetron and the like, and serves to radiate a microwave of a predetermined power toward a plasma generating area defined inside the conduit 20.

With the above arrangement, a mixed gas comprising the $SF_6$ gas, the $O_2$ gas, and the Ar gas with a predetermined composition is supplied to the conduit 20, and microwave of the predetermined magnitude or power is radiated by the microwave oscillator 23 toward the plasma generating area in the conduit 20, so that a plasma containing an active species gas in the form of fluorine (F) gas G is created, the F gas being flowing toward a downstream side. Thus, the conduit 20 ejects the F gas to a surface of an object to be etched in the form of a wafer 110, thereby etching it.

On the outside of the conduit 20, there is provided an exhaust pipe 24 through which unnecessary etching products created upon F-gas etching are caused to discharge to the outside of the vacuum vessel 1 under the action of a vacuum pump 24a.

Outside the vacuum vessel 1, there is provided a gas cylinder 22-4 storing therein a hydrogen gas which is to be supplied to the vacuum vessel 1 to make the interior space of the vacuum vessel 1 into a hydrogen atmosphere.

The X-Y drive mechanism 3 is a well-known mechanism which is capable of moving the stage 30 in an X-axis direction and in a Y-axis direction (i.e., in the right and left direction and in a direction perpendicular to the drawing sheet of FIG. 1) by means of unillustrated servo-motors.

The Z drive mechanism 4 is also a well-known conveying mechanism for moving the X-Y drive mechanism 3 in a Z-axis direction (i.e., in a vertical direction in FIG. 1) so as to change the distance between the ejection opening 20a of the conduit 20 and the adjacent surface of the wafer 110. Actually, the Z drive mechanism 4 comprises a linear guide device 40 and an electric motor 42.

More specifically, the linear guide device 40 is fixed to a support 41 firmly attached to a lower surface of the vacuum vessel 1, and has a shaft 40a which is coupled at its upper end to the X-Y drive mechanism 3. The motor 42 is controlled by the controller 5 and has a rotation shaft 42a coupled to the linear guide device 40.

With this arrangement, when the motor 42 is energized to rotate its rotation shaft 42a in one direction, the linear guide device 40 coupled to the rotation shaft 42a converts the rotary motion of the rotation shaft 42a into an upward movement of its shaft 40a. At this time, the shaft 40a, the upper end of which is coupled to the X-Y drive mechanism 3, raises the X-Y drive mechanism 3, whereby the stage 30 is moved in an upward direction together with the X-Y drive mechanism 3, casing the wafer 110 to approach the ejection opening 20a. On the other hand, reverse rotation of the rotation shaft 42a of the motor 42 causes the stage 30 to fall or lower, thus moving the wafer 110 away from the ejection opening 20a.

In this regard, if there is created dust during vertical movements of the shaft 40a of the linear guide device 40, it is discharged to the outside by means of a dust pump 10 mounted on the vacuum vessel 1.

Figure 2:
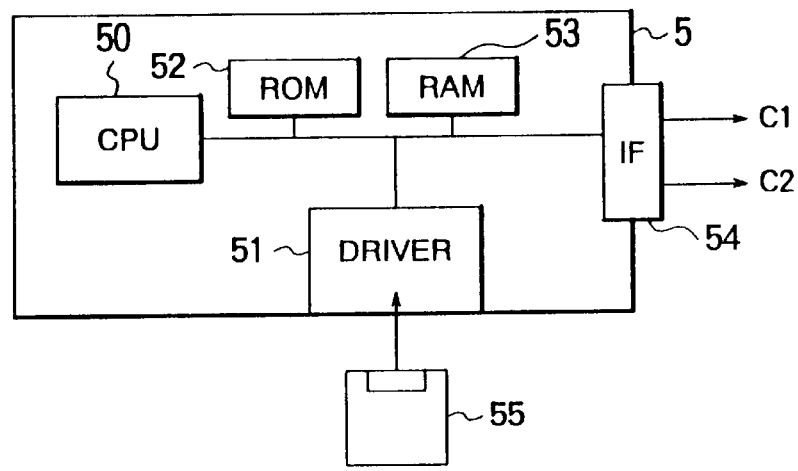
FIG. 2 is a block diagram of a controller.

The controller 5 serves to control the X-Y drive mechanism 3 and the Z drive mechanism 4. As illustrated in FIG. 2, the controller 5 comprises a CPU 50, a driver 51 connected to the CPU 50 through a bus, a ROM 52 and a RAM 53, and is connected to the X-Y drive mechanism 3 and the Z drive mechanism 4 through an interface 54, which is indicated at a reference symbol IF in FIG. 2.

The driver 51 is a drive mechanism capable of reproducing data stored in the recording medium 55 such as a floppy disc, a magneto-optical disc, etc. The recording medium 55 used for the driver 51 pre-stores data relating to respective convexes existing on the surface of the wafer 110.

Figure 3A:
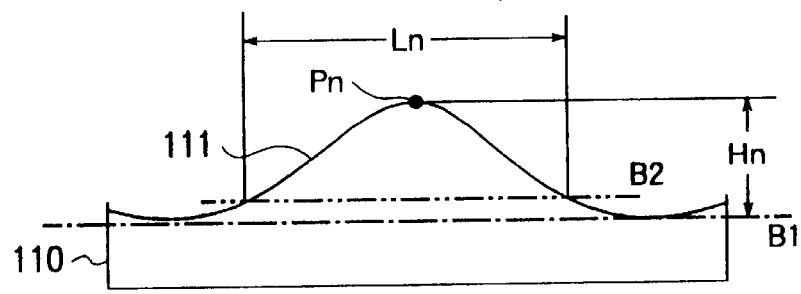
FIG. 3 is a schematic view showing a record to be stored in a recording medium, in which FIG. 3($a$) shows the position and size of a convex, and FIG. 3($b$) shows the stored state of the record.
Figure 3B:
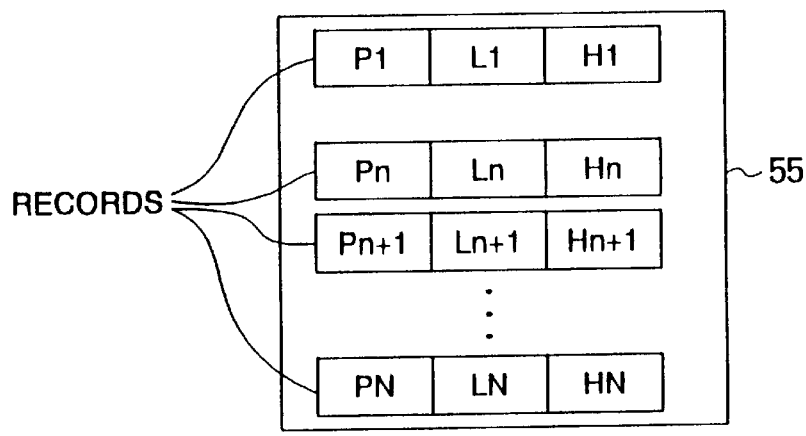

FIG. 3 is a schematic view showing the convex data stored in the recording medium 55. As shown in this figure, let us assume that there are N convexes on the surface of the wafer 110, and that position data representative of the position of each convex and area-and-height data representative of the area and height of each convex are measured and stored in the recording medium 55 beforehand. More specifically, as clearly shown in FIG. 3(a), for a nth (n≦N) convex 111, a position data Pn representative of the position of the nth convex 111 in X-Y coordinates, an area data Ln representative of the diameter of the nearest contour to a reference line B1 indicated at a chain line, and a height data Hn representative of the height of the nth convex 111 in a Z coordinate are recorded or stored as a single piece of record. As shown in FIG. 3(b), such record data for the 1st through Nth convexes 111 are stored in the recording medium 55.

The CPU 50 has a function of generating an X-Y control signal C1 for controlling the X-Y drive mechanism 3 and a Z control signal C2 for controlling the Z drive mechanism 4 based on the data read out of the recording medium 55 through the RAM 53 and outputting it to the X-Y drive mechanism 3 and the Z drive mechanism 4.

A control program to be executed by the CPU 50 for performing such a function is stored in the ROM 52, so that the CPU 50 can carry out various control based on the control program.

Figure 4:
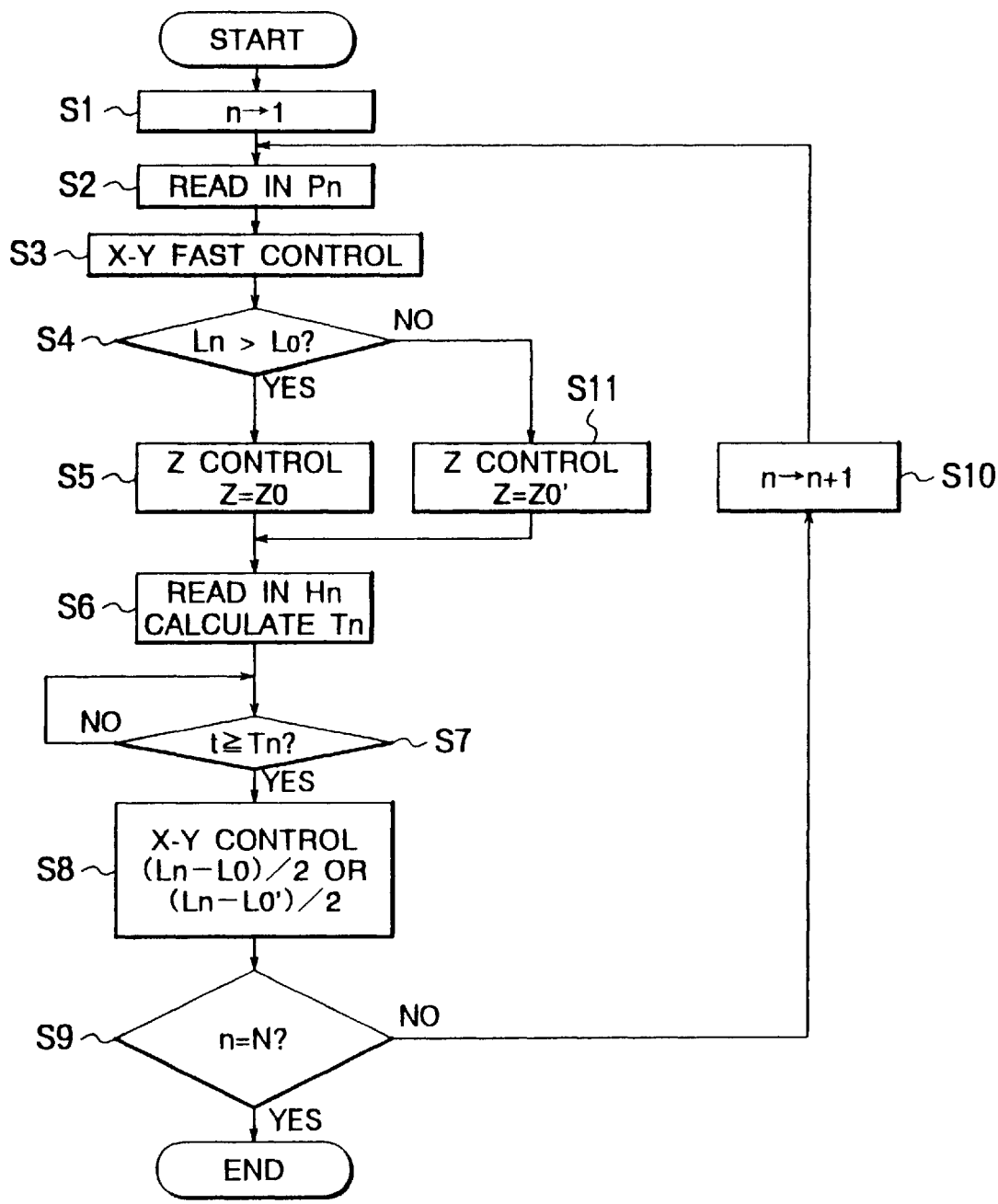
FIG. 4 is a flow chart showing the control operation of the controller.
Figure 5:
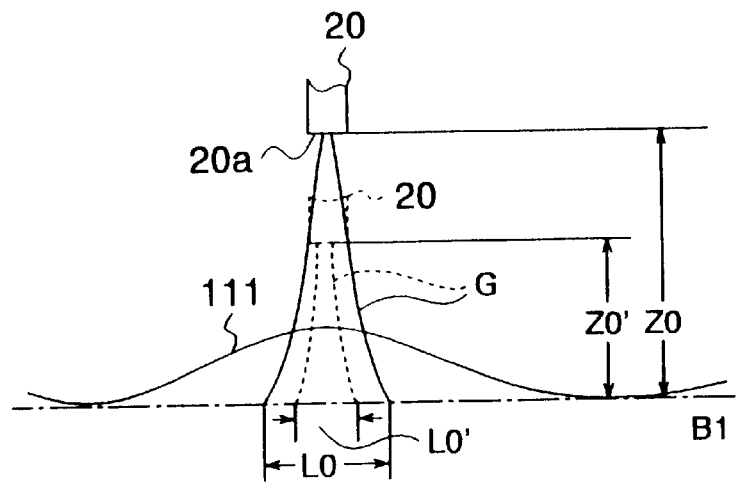
FIG. 5 is a schematic side elevational view showing a relationship between a first and a second set value representative of the respective heights of ejection openings and a reference value representative of an etching area.

FIG. 4 is a flow chart showing a control operation of the controller 5. As illustrated in FIG. 4, the controller 5 controls the X-Y drive mechanism 3 and the Z drive mechanism 4, and sequentially processes the 1st through Nth convexes 111 in this order. Specifically, the CPU 50 reads out the position data Pn from the record for the nth convex 111 (steps S1, S2), and generates an X-Y control signal C1 for controlling the X-Y drive mechanism 3 at a high speed so that the nth convex 111 is moved to a position just under the ejection opening 20a, as shown in FIG. 1 (step S3).

Subsequently, the area data Ln for the nth convex 111 is read in and It is determined whether the area data Ln is greater than a predetermined reference value L0 (step S4).

When the area data Ln is greater than the reference value L0, the controller 5 generates a Z control signal C2 for controlling the Z drive mechanism 4 so that the distance between the ejection opening 20a and the reference surface B1 is adjusted to a first predetermined value Z0 ("YES" in step S4, and step S5). On the other hand, if the area data Ln is not greater than the first predetermined value, a Z control signal C2 is generated for controlling the Z drive mechanism 4 such that the distance between the ejection opening 20a and the reference surface B1 is adjusted to a second predetermined value Z0', which is less than the first predetermined value Z0 ("NO" in step S4, and step S11).

In this regard, it is to be noted that the reference value L0 is a value of the diameter of a diffusion area of the F gas G when the height of the ejection opening 20a from the reference surface B1 is of the first predetermined value Z0, and hence it represents a corresponding etching area. Similarly, the reference value L0' is a value of the diameter of a diffusion area of the F gas G when the height of the ejection opening 20a from the reference surface B1 is equal to the second predetermined value Z0', and hence it represents a corresponding etching area. These reference values are experimentally determined beforehand.

As seen from FIG. 4, the controller 5 reads in the height data Hn, calculates a stay time Tn substantially in proportion to the height data Hn, and controls such that the nth convex 111 is stayed stationary at a position just under the ejection opening 20a only for the stay time Tn (steps S6, S7). That is, the controller 5 performs substantially the same processing as it controls an ejection time of the F gas G ejected from the ejection opening 20a in accordance with the size of the convex 111.

Figure 6:
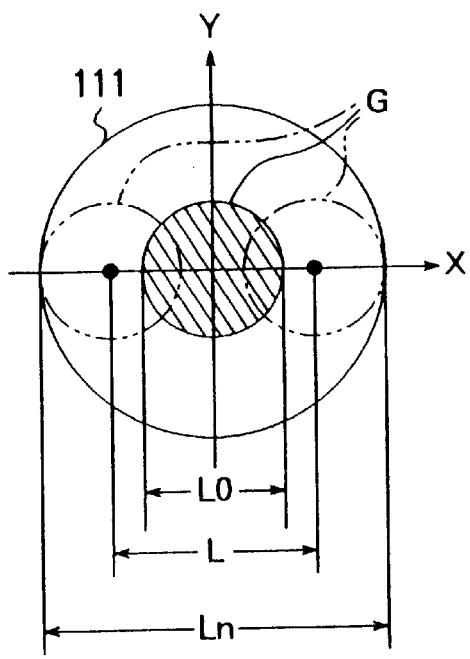
FIG. 6 is a schematic plan view showing swinging movements of the convex portions.

In this case, however, when the ejection opening 20a is at a height of the first predetermined value Z0, the diameter of the corresponding etching area is equal to the reference value L0. Thus, as shown in FIG. 6, if the area Ln of the nth convex 111 is greater than the reference value L0, a large part of the peripheral portion of the nth convex 111 might remain intact (non-etched) after the etching treatment.

In order to cope with this problem, the controller 5 generates, after the lapse of the stay time Tn, an X-Y signal C1 for swingingly moving the nth convex 111 by a length of L (=(Ln−L0)/2) both in the X-axis direction and in the Y-axis direction (step S8).

Similarly, when the ejection opening 20a is at a height of the second predetermined value Z0', the controller 5 generates an X-Y control signal C1 for moving the nth convex 111 by a distance L (=(Ln−L0')) both in the X direction and in the Y direction.

Thereafter, as illustrated in FIG. 4, it is determined whether the nth convex 111 is the last one (step S9). If the answer to this question is negative, the next position data Pn+1 for the next (n+1)th convex 111 is read in so that the X-Y drive mechanism 3 is fast controlled to swiftly move the next convex 111 to a position just under the ejection opening 20a. Then, the same processing as above is repeated ("NO" in step S9, steps S10, S2 and S3). On the other hand, if the nth convex 111 is the last one, the processing is finished ("YES" in step S9).

Now, the operation of the plasma etching apparatus according to this embodiment will be described, which realizes a plasma etching method according to the present invention. Here, for a better understanding of the invention, a process of flattening a silicon wafer 110 having four convexes 111-1 through 111-4 will be described.

First, let us assume that upon measuring the silicon wafer 110, the records of the respective convexes 111-1 through 111-4 be (P1, L1, H1). (P2, L2, H2), (P3, L3, H3) and (P4, L4, H4), respectively, and that the following conditions be established:

L1>L0, L2=L0, L0>L3>the reference value L0', L4=L0'

The recording medium 55 storing the above records is set on the driver 51 of the controller 5, as shown in FIG. 2, and the plasma generator 2 and the controller 5 shown in FIG. 1 are actuated so that the F gas G is ejected from the ejection opening 20a of the diameter D toward the silicon wafer 110. Simultaneous with this, the CPU 50 reads in the position data P1 from the record for the convex 111-1 (steps S1, S2 in FIG. 4), and generates an X-Y control signal C1 to the X-Y drive mechanism 3.

Thus, based on the position data P1, the X-Y drive mechanism 3 drives the stage 30 at a high speed to place the convex 111-1 to a position just under the ejection opening 20a (step S3 in FIG. 4). At this moment, an area data L1 for the convex 111-1 is read in, but the area data L1 thus read in is greater than the reference value L0, so that a Z control signal C2 is output from the controller 5 to the Z drive mechanism 4 which drives the X-Y drive mechanism 3 and the stage 30 to move in unison in a downward direction to such an extent that the distance between the ejection opening 20a and the reference surface B1 becomes equal to the first predetermined value Z0 ("YES" in step S4, and step S5 in FIG. 4).

As a consequence, an etching area of the reference value L0 is ensured, so that the convex 111-1 is etched by the F gas G ejected to and diffused over this etching area.

At this time, the convex 111-1 stays at a position just under the ejection opening 20a only for the period of time T1 calculated based on the height data H1 (step S7 in FIG. 4), so that the F gas G is ejected to the convex 111-1 for a longer period of time. As a result, the etching area for the convex 111-1 is flattened very well. Since the area data L1 of the convex 111-1 is greater than the reference value L0, an X-Y control signal C1 is generated from the controller 5 to the X-Y drive mechanism 3, whereby the convex 111-1 is swung or moved by a distance (L1−L0)/2 both in the X-axis direction and in the Y-axis direction, thus etching the peripheral portion of the convex 111-1 in a uniform manner (step S8 in FIG. 4), whereupon the F gas G diffuses to the outside of the convex 111-1, giving rise to a possibility that portions other than the convex 111-1 might be etched. However, the atmosphere surrounding the F gas G is filled with a hydrogen gas supplied from the gas cylinder 22-4, so the F gas G having diffused to the outside of the convex 111-1 reacts with the hydrogen gas to be turned into an inactive HF gas. As a result, substantially no etching will take place on the portions of the wafer 110 outside the convex 111-1.

Figure 8A:
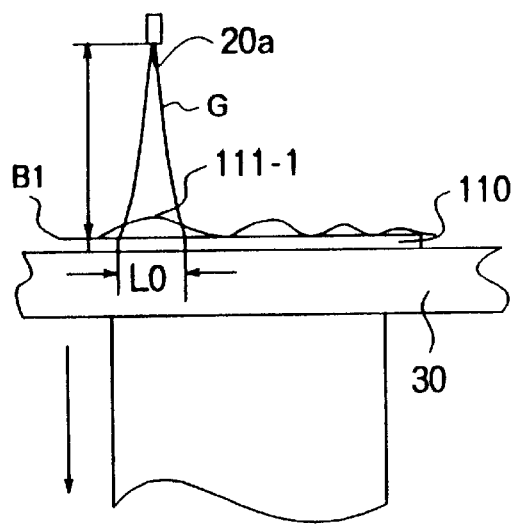
FIGS. 8($a$)–8($d$) is a schematic view showing the operation of the plasma etching apparatus of FIG. 1.
Figure 8B:
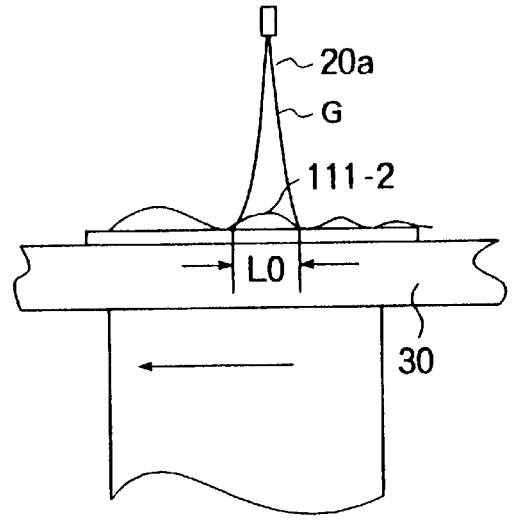
Figure 8C:
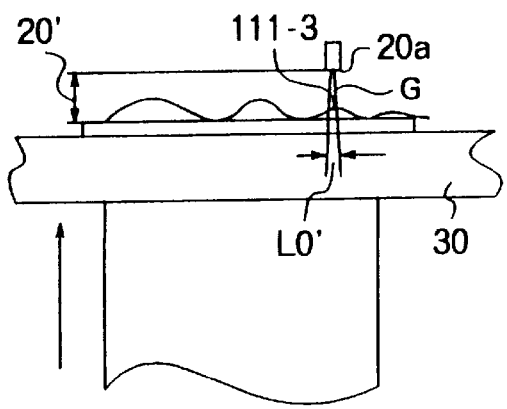

Thereafter, the next convex 111-2 is selected as a target, and the position data P2 for the convex 111-2 is read in ("NO" in steps S9, S10 and S2 in FIG. 4), whereby the convex 111-2 is moved to a position just under the ejection opening 20a at a high speed (step S3 in FIG. 4), as shown in FIG. 8(b). Thereafter, the same processing operation as in the case of the convex 111-1 will be carried out (steps S4 through S9). In this connection, however, it is to be noted that since H2<H1, the stay time T2 of the convex 111-2 is shorter than the stay time T1 of the convex 111-1. Also, due to the fact that the area data L2 of the convex 111-2 is equal to the reference value L0, a relation {(L2−L0)/2=0} is established, resulting in no swinging movement of the convex 111-2 in the X-axis and Y-axis directions.

After the processing of the convex 111-2, the convex 111-3 is selected as the following target, and the position data P3 of the convex 111-3 is read in, so that the convex 111-3 is fast moved to a position just under the ejection opening 20a ("NO" in steps S9, S10, S2, S3 in FIG. 4). Subsequently, the area data L3 of the convex 111-3 is read in, which is less than the reference value L0, so that the stage 30 is driven to move in the upward direction to such an extent that the distance between the ejection opening 20a and the reference surface B1 is reduced to the second preset value Z0' ("NO" in steps S4 and S11 in FIG. 4).

As a consequence, a limited etching area of the reference value L0' is ensured, the convex 111-3 is subjected to etching by means of the F gas G which is ejected to and diffused over that etching area.

After this, substantially the same processing operation is carried out as in the case of the convex 111-1. Thus, the convex 111-3 is stayed stationary just under the ejection opening 20a only for a period of time T3 (<T2) calculated on the basis of the height data H3 (steps S6 and S7 in FIG. 4), and then it is swung or moved by a distance (L3−L0')/2 both in the X-axis direction and in the Y-axis direction, so that the convex 111-3 is uniformly etched (step S8 in FIG. 4).

Figure 8D:
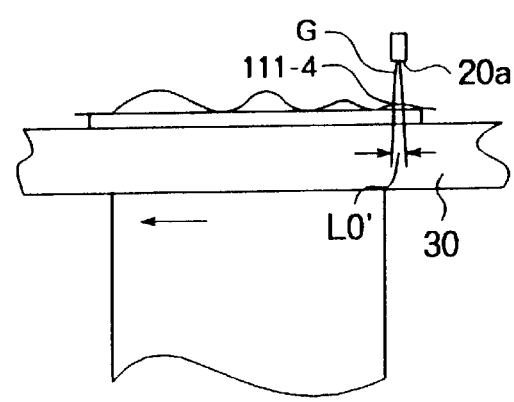

Then, the convex 111-4 is selected as a target, and the position data P4 thereof is read in. As shown in FIG. 8(d), the convex 111-4 is moved to a position just under the ejection opening 20a at a high speed ("NO" in steps S9, S10, S2, and S3). Thereafter, the same processing operation is carried out as in the case of the above-mentioned convex 111-3 (steps S4, and S11 through S8). Here, it is to be noted that the stay time T4 of the convex 111-4 is the shortest, and since the area data L4 of the convex 1114 is equal to the reference value L0', there is no swinging movement of the convex 111-4 in the X-axis and Y-axis directions.

In this manner, the entire processing operations of the silicon wafer 110 have been finished ("YES" in step S9 in FIG. 4).

With the plasma etching apparatus as described above, a plurality of silicon wafers 110 each having a diameter of 6 inches were processed with the result that the total thickness variation (TTV) thereof was improved from 0.48 $\mu$m by 0.25 $\mu$m on the average, and the standard deviation of variation thereof is equal to or less than 0.03. Thus, it was found that the plasma etching apparatus of the present invention exhibits satisfactory performance as a wafer flattening apparatus.

As clearly seen from the foregoing, according to this embodiment, for a convex 111 on a surface of the wafer 110 which has an area data Ln greater than the predetermined reference value L0, the stage 30 is driven to move in the downward direction to make the distance between the ejection opening 20a and the convex 111 larger so as to ensure a correspondingly large etching area, whereas for a convex 111 having an area data Ln equal to or less than the predetermined reference value L0, the stage 30 is driven to move in the upward direction to make the distance between the ejection opening 20a and the convex 111 smaller so as to ensure a smaller etching area corresponding to the small convex 111. With this arrangement, by the use of a single plasma generator 2 with an ejection opening 20a having a predetermined diameter D, it is possible to flatten a variety of convexes 111 of varying areas or diameters, as a result of which provision of a single treatment chamber is satisfactory, thereby reducing the cost of equipment. Moreover, a step or process of repeatedly transporting a wafer 110 from one treatment chamber to another for a plurality of treatments or processings can be omitted, so the total throughput of the apparatus can be improved to a substantial extent.

Furthermore, the stay time Tn of each convex is controlled by the height thereof, so that a period of time of ejecting an F gas G can be ensured corresponding to the convex height. As a consequence, a variety of convexes 111 having various sizes or areas can be flattened in a reliable and effective manner.

Since the F gas being ejected is surrounded by a hydrogen atmosphere, it is possible to etch the convexes 111 exclusively with high reliability.

SECOND EMBODIMENT

A plasma etching apparatus in accordance with a second embodiment of the present invention will next be described below, which is different from the aforementioned plasma etching apparatus in accordance with the first embodiment in that the distance between the ejection opening 20a and a wafer 110 to be processed can be varied in a continuous manner.

Figure 9:
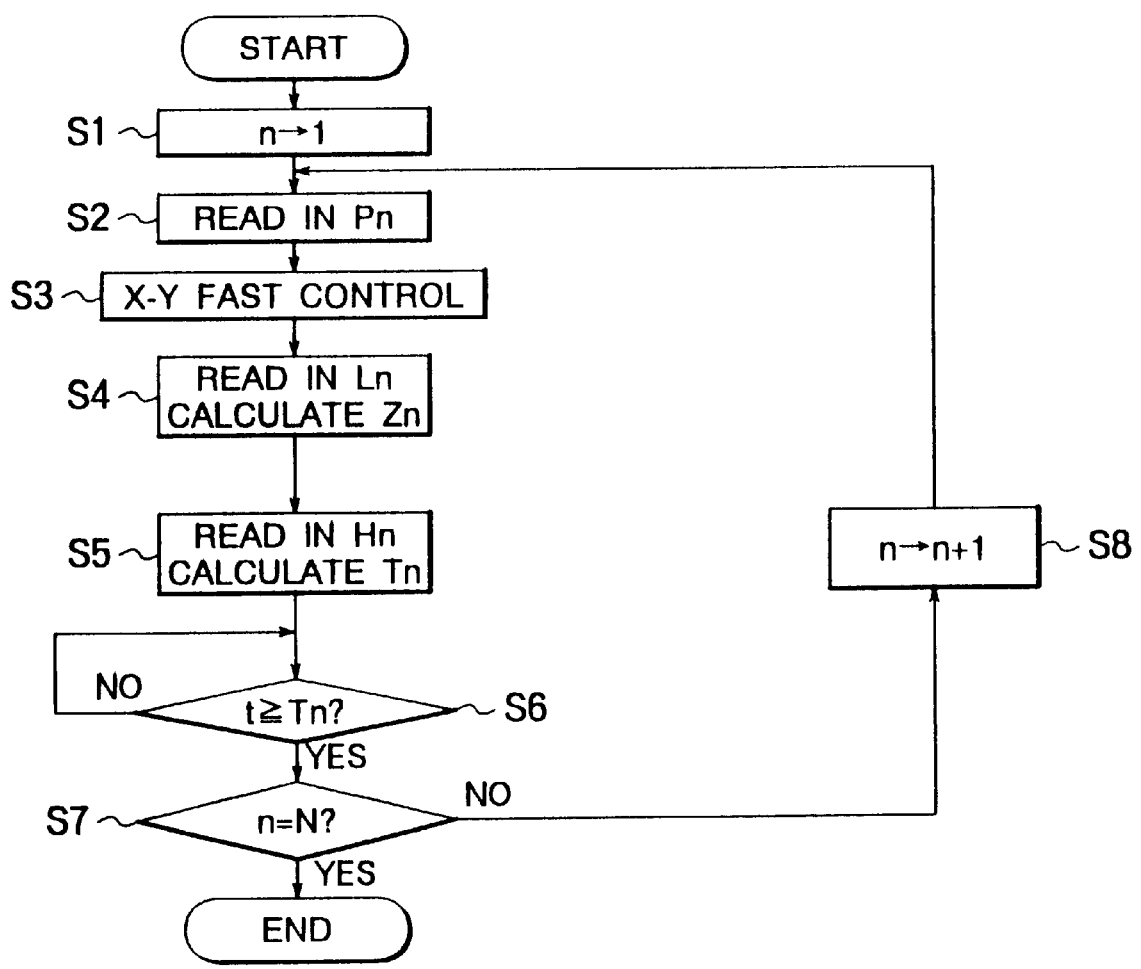
FIG. 9 is a flow chart showing a flow of control of the controller of the plasma etching apparatus in accordance with a second embodiment of the present invention.
Figure 10A:
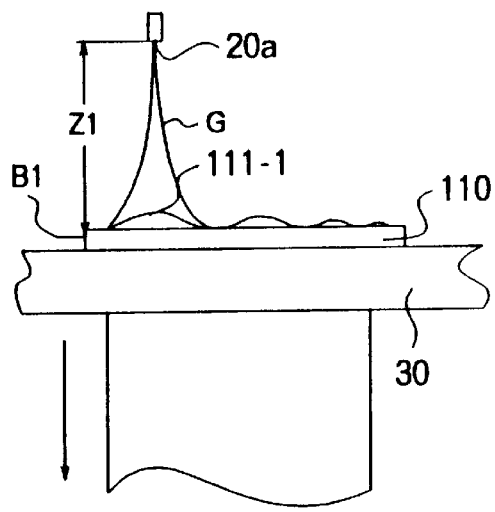
FIGS. 10($a$)–10($d$) is a schematic view showing the operation of the plasma etching apparatus of FIG. 9.
Figure 10B:
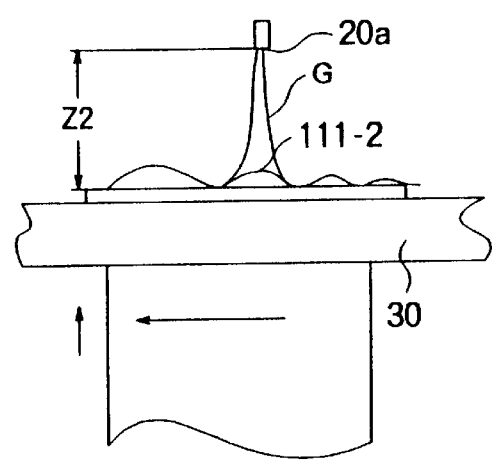
Figure 10C:
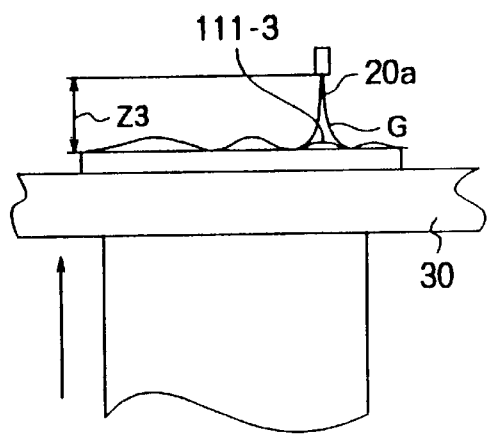
Figure 10D:
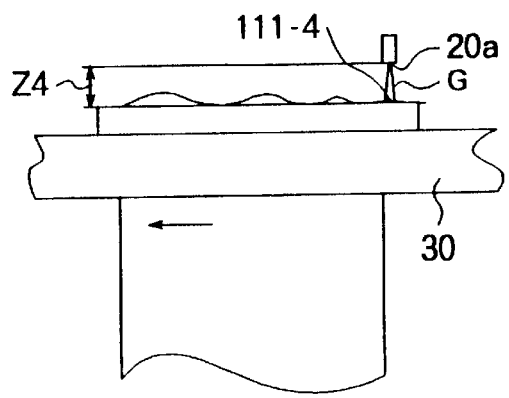

FIG. 9 is a flow chart showing the control operation of the controller 5 of this embodiment. As shown in FIG. 9, the steps S1 through S8 for sequentially processing the 1st through Nth convexes 111 in this order, and the steps S2, S3 of reading in the position data Pn of the nth convex 111 and moving this convex 111 to a position just under the ejection opening 20a are the same as the corresponding steps of the above-mentioned first embodiment.

However, as shown in step S4, the control operation of this embodiment differs from the first embodiment in that the distance Zn between the ejection opening 20a and the reference surface B1 of the wafer 110 (see FIG. 3(a)) is controlled in accordance with the area data Ln.

More specifically, the controller 5 calculates the distance Zn using the following equation based on the area data Ln of the nth convex 111, Zn=k×Ln (k: a proportionality factor) and generates a Z control signal C2 for driving the Z drive mechanism 4 to move in the vertical direction so that the actual distance between the ejection opening 20a and the reference surface B1 becomes equal to the thus calculated distance value Zn.

Here, it is to be noted that the value Zn is such a value that when the F gas G is ejected from this height, an etching area to be etched by the F gas G has a diameter substantially equal to the area data Ln of the nth convex 111, which is dependent on the proportionality factor k experimentally determined.

The nth convex 111 being in the above-mentioned state is stayed stationary just under the ejection opening 20a only for a period of time Tn substantially proportional to the height data Hn, during which it is subjected to an etching operation. After completion of such processing of the nth convex 111, processing moves to the following or (n+1)th one 111 ("NO" in steps S5 through S7, steps S8 and S2).

Figure 7:
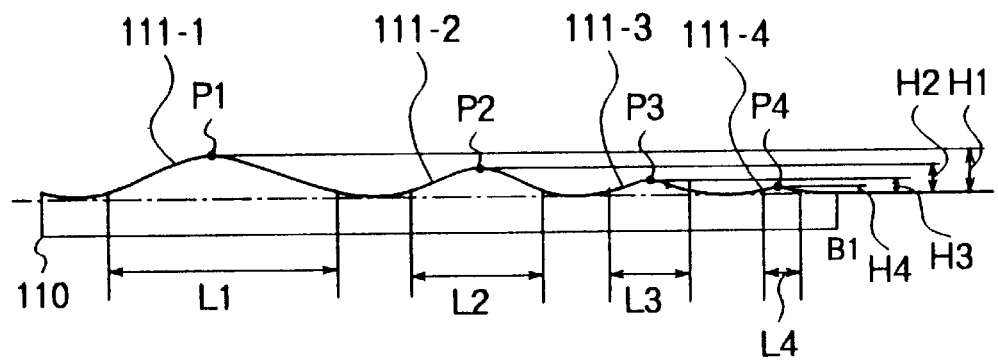
FIG. 7 is a schematic side elevational view showing an example of a silicon wafer.

With the above arrangement, for example, in the case of a silicon wafer being flattened as illustrated in FIG. 7, the respective distances Z1 through Z4 between the reference surface B1 and the ejection opening 20a with the 1st through 4th convexes 111-1 through 111-4, respectively, are continuously varied in accordance with the sizes or areas of these convexes 111-1 through 111-4, so that the F gas G can be ejected to and diffused over all the convexes 111-1 through 111-4.

Accordingly, swinging movements of the convexes 111-1 through 111-4 as shown in step S8 in FIG. 4 can be omitted, thus making it possible to correspondingly shorten the period of time of the etching operation.

The construction and operation of this embodiment other than the above are substantially similar to those of the aforementioned first embodiment, and hence a description thereof is omitted.

THIRD EMBODIMENT

A plasma etching apparatus in accordance with a third embodiment of the present invention will now be described below, which is different from the aforementioned plasma etching apparatuses in accordance with the first and second embodiments in that the density of F gas G can be varied in dependence upon the size or area of each convex 111.

Figure 11:
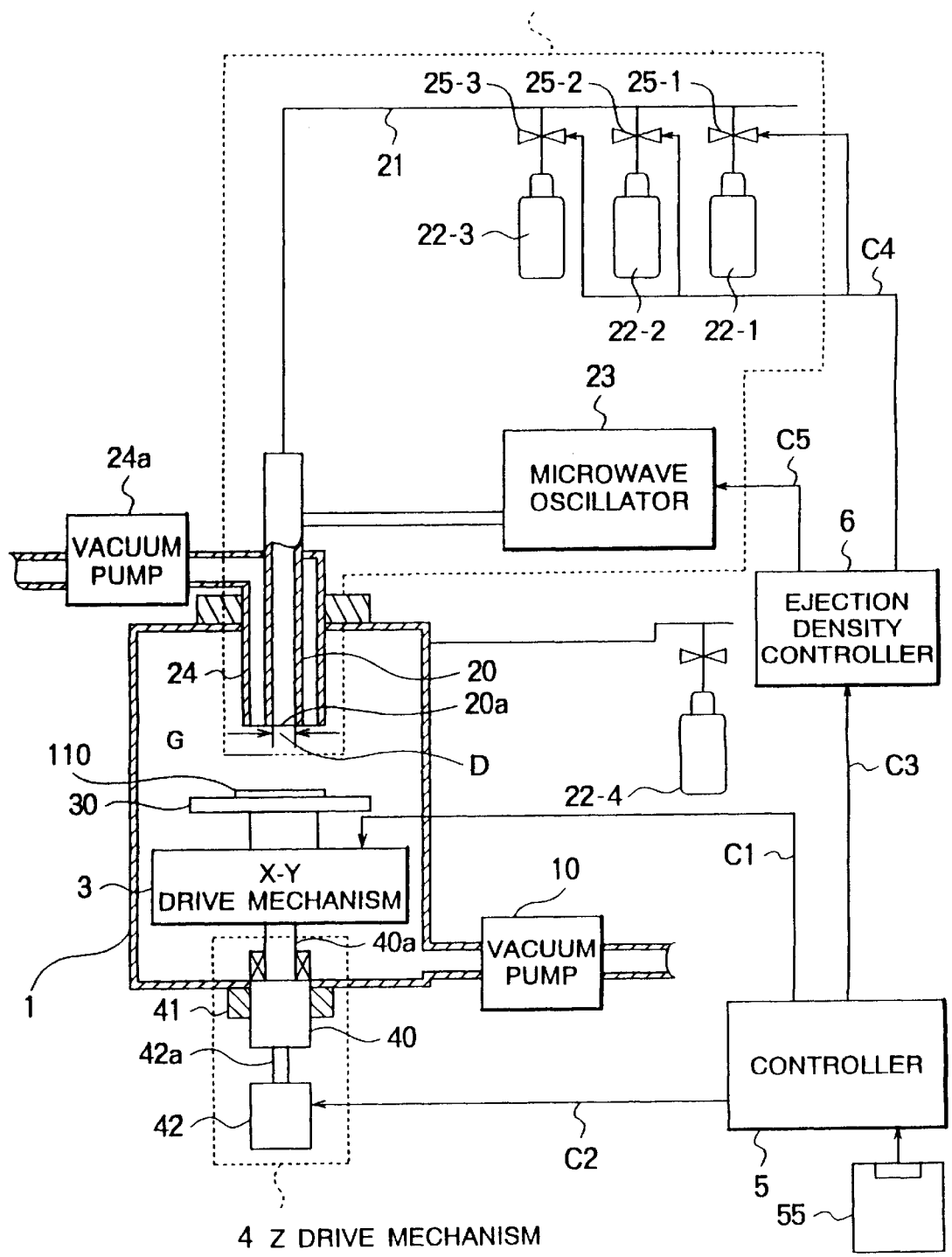
FIG. 11 is a view showing the construction of a plasma etching apparatus in accordance with a third embodiment of the present invention.
Figure 12:
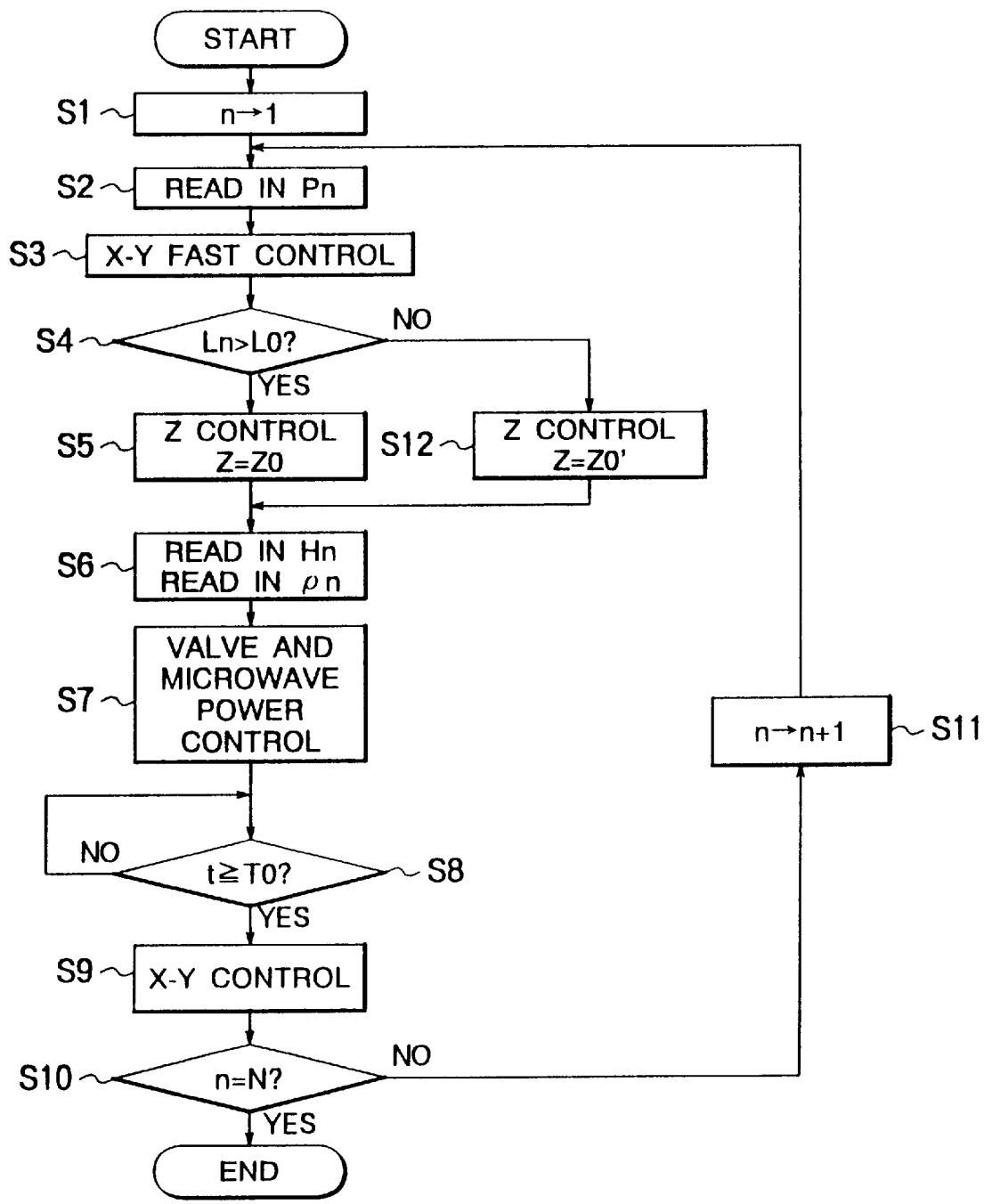
FIG. 12 is a flow chart showing the control operation of a controller of the plasma etching apparatus of FIG. 11.

FIG. 11 illustrates the construction of the plasma etching apparatus of this embodiment, and FIG. 12 is a flow chart showing the control operation of the controller 5 of this embodiment.

As shown in FIG. 11, the plasma etching apparatus of this embodiment is equipped with a third control means in the form of an ejection density controller 6 for controlling the operations of electromagnetic valves 25-1 through 25-3 provided on the gas cylinders 22-1 through 22-3 and a microwave oscillator 23.

In the course of the control operation of the controller 5, as illustrated in FIG. 12, the steps S1 through S11 for sequentially processing the 1st through Nth convexes 111 in this order, and the steps S3 through S5 and step S12 of reading in the position data Pn of the nth convex 111 and moving this convex 111 to a position just under the ejection opening 20a and controlling the distance Z between the ejection opening 20a and the reference surface B1 based on the area data Ln are the same as the corresponding steps of the above-mentioned first embodiment.

However, as shown in steps S6 and S7, the control operation of this embodiment differs from the first embodiment in that the ejection density of the F gas G from the conduit 20 is controlled in accordance with the height data Hn of the nth convex 111. Specifically, the controller 5 calculates the ejection density ρn using the following equation based on the height data Hn of the nth convex 111;

ρn=m×Hn (m: a proportionality factor) and generates a density control signal C3 to the ejection density controller 6 for controlling the actual ejection density of the F gas G from the ejection opening 20a to the thus calculated ejection density ρn. Here, it is to be noted that the value ρn is such a value that when the F gas G of the density ρn is ejected to the nth convex 111, it is possible to flatten the nth convex 111 in a predetermined short period of time T0. The value ρn is dependent on the proportionality factor m which is determined experimentally.

The density control signal C3 indicates an amount of the F gas G comprising $SF_6$, $O_2$ and Ar with a predetermined composition, and an oscillation frequency of the microwave oscillator 23. These values for the F gas amount and the oscillation frequency are beforehand experimentally collected as data.

The controller 5 outputs the density control signal C3 to the ejection controller 6, and performs, after the lapse of the predetermined time T0, control of swingingly moving the nth convex 111 both in the X-axis and Y-axis directions, after which processing is moved to the following (n+1)th convex 111 (steps S8 through S11, and step S2).

On the other hand, the ejection density controller 6 shown in FIG. 11 generates a control signal C4 based on the density control signal C3 from the controller 5 to thereby control the electromagnetic valves 25-1 through 25-3, and it also generates a control signal C5 to thereby control the microwave oscillator 23.

Specifically, the electromagnetic valves 25-1 through 25-3 are controlled to open and close by the ejection density controller 6, so that the $SF_6$ gas, the $O_2$ gas and the Ar gas in the gas cylinders 22-1, 22-2 and 22-3 are supplied to the conduit 20 at respective quantities indicated by the density control signal C3, and the microwave oscillator 23 is controlled to radiate microwave into the conduit 20 at an oscillation frequency indicated by the density control signal C3.

With the above arrangement, for example, in the case of a silicon wafer being flattened as illustrated in FIG. 7, the ejection density ρ1 of the F gas G for the convex 111-1 is the greatest, and the ejection densities ρ2, ρ3 for the convexes 111-2, 111-3 decrease in this order, with the ejection density ρ4 for the convex 111-4 being the smallest. Accordingly, it is possible to flatten the convexes 111-1 through 111-4 in a predetermined short period of time T0 in a reliable manner, so in comparison with the aforementioned first embodiment in which the stay time of a convex increases in dependence on the size or area thereof, the time required for etching is extremely shortened.

The construction and operation of this embodiment other than the above are substantially similar to those of the aforementioned first and second embodiments, and hence a description thereof is omitted.

It should be understood that the present invention is not limited to the above-described embodiments but can be modified or changed in a variety of ways within the scope and spirit of the present invention as defined in the appended claims.

For example, although in the above-mentioned embodiments, it is constructed such that the stage 30 is moved vertically to change the distance between the ejection opening 20a and the wafer 110, the stage 30 can be stationary with the conduit 20 of the plasma generator 2 being moved toward or away from the wafer 110.

Moreover, during the operation of the plasma etching apparatus, the F gas G is continuously ejected from the conduit 20, but during the time when processing is transferred from one convex to the following convex, ejection of the F gas G may be stopped.

Furthermore, although the plasma generating means comprises a plasma generator 2 which radiates microwave of a predetermined power toward the plasma generating area in the conduit 20 to thereby generate a plasma containing an active species gas in the form of an F gas G, it can comprise, in place of the plasma generator 2, an inductively coupled plasma generator (ICP) using a high-frequency wave, a capacitively coupled plasma generator, a plasma generator using a helicon wave, an electron cyclotron resonance (ECR) source, or the like, for example.

Further, the plasma generating gas comprises a mixed gas containing $SF_6$, $O_2$ and Ar, but $SF_6$ in the mixed gas may be replaced by a fluorocarbon-based gas such as $CF_4$.

Still more, although in the control of the controller 5 in the third embodiment, height control is effected at two stages or in a stepwise manner in steps S4, S5 and S12 of FIG. 12 as in the first embodiment, it can be carried out in a continuous manner as in the control of the second embodiment (step S4 in FIG. 9).

Figure 13:
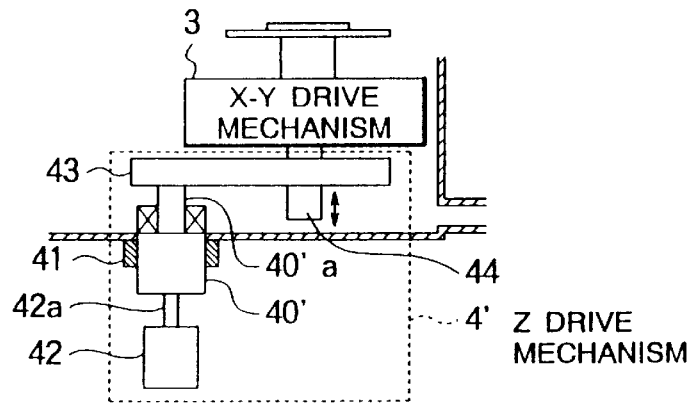
FIG. 13 is a cross sectional view showing a modified form of a Z drive mechanism.
Figure 14:
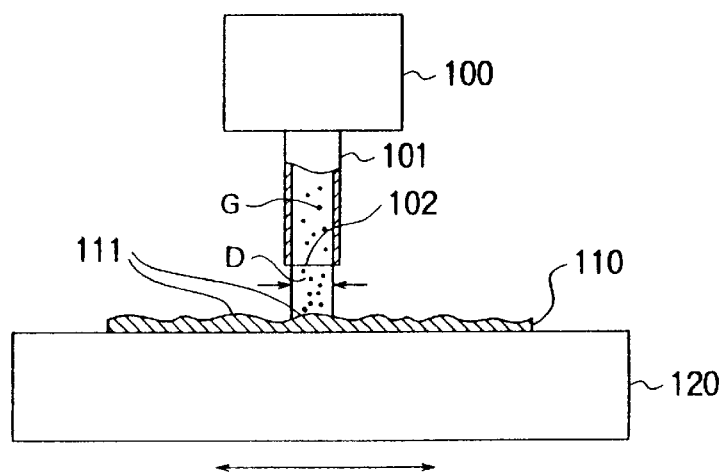
FIG. 14 is a schematic view showing the principle of a conventional plasma etching apparatus.
Figure 15:
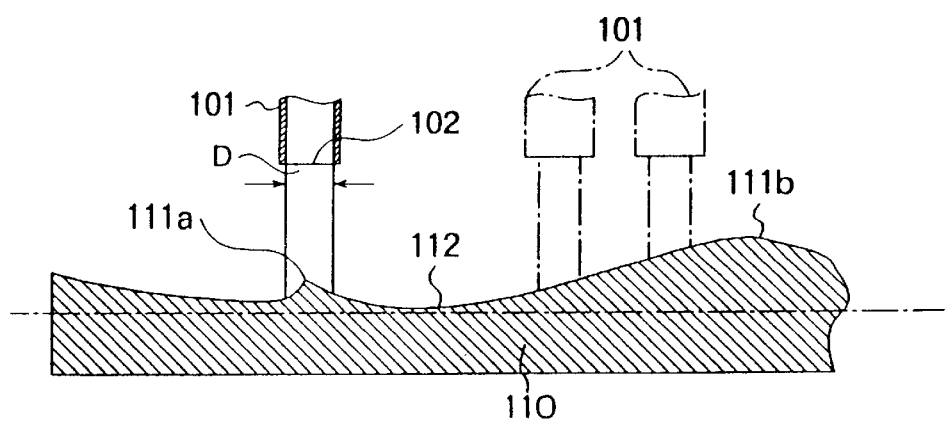
FIG. 15 is a schematic view showing a surface flattening treatment in accordance with the conventional plasma etching apparatus.
Figure 16:
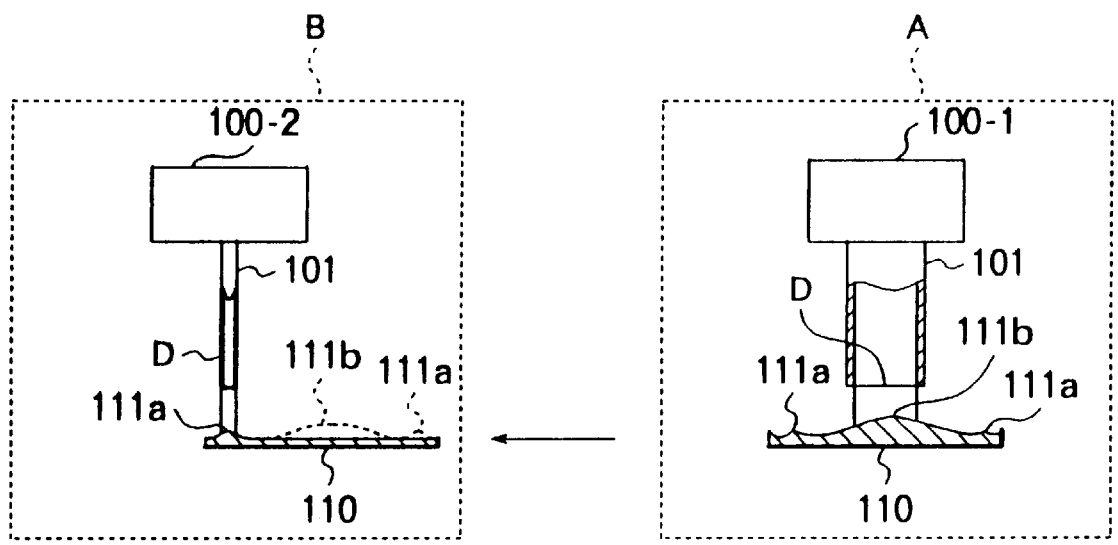
FIG. 16 is a schematic view showing a construction of a conventional plasma etching apparatus which is used for carrying out a surface flattening treatment in a short period of time.

In the above-mentioned embodiments, the distance adjusting means comprises the Z drive mechanism 4 which is constructed of the linear guide device 40 and the motor 42, but as shown in FIG. 13, it can instead comprise a Z drive mechanism 4' which is constructed of a rotary guide device 40', a motor 42, and a rotation shaft 42a of a gear mechanism 43. That is, the rotational force of the rotation shaft 42a of the motor 42 is received by the rotary guide device 40', and the rotation of the rotation shaft 40a' of the rotary guide device 40' is then converted into a vertical movement by means of the gear mechanism 43.

As described in detail in the foregoing, according to the present invention, it is possible to perform a surface flattening treatment on an object to be etched which has convexes having varying sizes or areas simply by changing the distance between a convex to be etched and an ejection opening for ejecting an active species gas in an plasma generating means. This serves to shorten the time required for the surface flattening operation. Such a surface flattening operation can be carried out by use of the single plasma generating means, so provision of a single treatment chamber is satisfactory for treating or processing a variety of convexes of varying sizes or areas, resulting in a substantial reduction in the cost of equipment. Also, a step or process of transporting the object to be etched from one treatment chamber to another treatment chamber can be omitted, thus contributing to an improvement in the total throughput to a substantial extent.

Moreover, a period of time of ejecting the active species gas to a convex can be controlled in accordance with the size or area of the convex, so as to flatten the convex having a large area in a reliable manner. On the other hand, the ejection time of the active species gas can be shortened so as to flatten the convex having a small area in a reliable and effective manner.

Furthermore, a density of the active species gas can be controlled in accordance with the area of the convex, so that the time required for the surface flattening operation can further be reduced.

Still further, a hydrogen gas is supplied to surroundings of the active species gas ejected from the ejection opening, so that the active species gas spreading outside the convex reacts with hydrogen, thereby preventing unwanted etching of those portions of the object other than the convex. Thus, the surface flattening operation can be carried out with high precision.

What is claimed is:

1. A plasma etching method comprising the steps of:

disposing an ejection opening of a predetermined diameter in plasma generating means in confrontation with a prescribed convex of an object to be etched; and ejecting an active species gas from said ejection opening to said convex to thereby flatten it through etching;

wherein a distance between said ejection opening and said convex is varied to provide an etching area corresponding to an area of said convex.

2. The plasma etching method according to claim 1, wherein a period of time of ejecting said active species gas is controlled in accordance with the area of said convex.

3. The plasma etching method according to claim 1, wherein a density of said active species gas is controlled in accordance with the area of said convex.

4. The plasma etching method according to claim 1, wherein a hydrogen gas is supplied to surroundings of said active species gas ejected from said ejection opening.

* * * * *